United States Patent [19]
Omura

[11] Patent Number: 5,805,357
[45] Date of Patent: Sep. 8, 1998

[54] CATADIOPTRIC SYSTEM FOR PHOTOLITHOGRAPHY

[75] Inventor: Yasuhiro Omura, Tokyo, Japan

[73] Assignee: Nikon Corporation, Tokyo, Japan

[21] Appl. No.: 873,528

[22] Filed: Jun. 12, 1997

[30] Foreign Application Priority Data

Jun. 14, 1996 [JP] Japan .................................. 8-175925

[51] Int. Cl.⁶ .................................................. G02B 17/08
[52] U.S. Cl. ........................... 359/727; 359/732; 359/738
[58] Field of Search ..................................... 359/726, 727, 359/732

[56] References Cited

U.S. PATENT DOCUMENTS

| | | | |
|---|---|---|---|
| 5,289,312 | 2/1994 | Hashimoto et al. | ..................... 359/727 |
| 5,668,672 | 9/1997 | Oomura | .................................. 359/727 |
| 5,694,241 | 12/1997 | Ishiyama et al. | ........................ 359/727 |

FOREIGN PATENT DOCUMENTS

WO 95/32446  11/1995  WIPO .

*Primary Examiner*—Scott J. Sugarman
*Attorney, Agent, or Firm*—Klarquist Sparkman Campbell Leigh & Whinston, LLP

[57] ABSTRACT

Catadioptric systems are disclosed that project a demagnified image of an object on a substrate. A first optical system substantially collimates a light flux from the object and directs the light flux to a beamsplitter provided with a reflecting surface. A second optical system comprising a concave mirror and a negative lens and having unit magnification receives the light flux from the beamsplitter and directs the light flux back to the beamsplitter. A third optical system then receives the light flux from the beamsplitter and forms an image of the object on the substrate. The catadioptric systems satisfy various conditions.

20 Claims, 6 Drawing Sheets

```
................ 193.5 nm
—·—·—·— 193.45 nm
——————— 193.4 nm
- - - - - - - 193.35 nm
—··—··—··— 193.3 nm
```

Y=15

Y=7.5

Y=0

............... 193.5 nm
—·—·—·—·— 193.45 nm
———————— 193.4 nm
-------- 193.35 nm
—··—··—··— 193.3 nm

```
················ 193.5 nm
─·─·─·─·─ 193.45 nm
─────────── 193.4 nm
─ ─ ─ ─ ─ ─ 193.35 nm
─··─··─··─ 193.3 nm
```

CATADIOPTRIC SYSTEM FOR PHOTOLITHOGRAPHY

FIELD OF THE INVENTION

The present invention pertains to catadioptric systems for photolithography.

BACKGROUND OF THE INVENTION

In photolithographic processes for integrated circuit manufacture, projection exposure systems project patterns from a mask onto a sensitized wafer or glass plate. Because of the small feature sizes of integrated circuits, projection exposure systems for photolithography must project high-resolution patterns from the mask. The resolution of such projection systems can be increased by using short-wavelength illumination or increasing the numerical aperture of the optical system.

Short-wavelength illumination is absorbed by many optical materials. At wavelengths below 300 nm, the only practical materials are fused silica and fluorite. Unfortunately, the Abbe numbers of quartz and fluorite not sufficiently different to permit complete correction of chromatic aberration. Therefore, refractive optical systems used at wavelengths less than 300 nm generally exhibit chromatic aberration.

Reflective systems, however, do not exhibit chromatic aberration. Therefore, various catadioptric systems (i.e., optical systems combining reflective and refractive elements) have been developed for short-wavelength photolithography.

Catadioptric systems having a beamsplitter with a partially reflecting surface are disclosed in Japanese laid-open patent documents 6-300973 (1994), 5-88089 (1993), and 3-282527 (1991), and Japanese patent document 7-117648 (1995), and PCT/EP95/01719. If light loss and loss of image contrast due to stray light are to be avoided, the beamsplitter in these catadioptric systems must be a polarizing beamsplitter as disclosed in Japanese laid-open patent document 282527 (1991).

A polarizing beamsplitter generally comprises a multilayer film that transmits light fluxes having one state of polarization and reflects orthogonally polarized light fluxes. For wavelengths less than 230 nm, only a limited number of materials are suitable for such a multilayer film because most materials absorb light fluxes at such short wavelengths.

The multilayer film of a polarizing beamsplitter generally exhibits variations in reflectance and transmittance as a function of an angle of incidence of a light flux. In conventional catadioptric systems, a polarizing beamsplitter receives converging or diverging light fluxes. It is difficult to avoid absorption and degraded image quality from stray light resulting from the angular dependence of the multilayer film. In addition, the multilayer film produces wave-front aberrations that further reduce resolution and increase distortion.

In conventional catadioptric systems, a quarter-wave retarder is usually placed between the polarizing beamsplitter and a concave mirror that receives a light flux from the polarizing beamsplitter and reflects the light flux back to the polarizing beamsplitter. In these systems, the quarter-wave retarder transmits uncollimated light fluxes. These uncollimated light fluxes exit the quarter-wave retarder with a non-uniform state of polarization because the retardance of the quarter-wave retarder varies with angle of incidence. Therefore, the advantages of using a polarizing beamsplitter are reduced and conventional catadioptric systems exhibit reduced resolution, increased light loss, and increased stray light.

SUMMARY OF THE INVENTION

Preferred embodiments of a catadioptric system according to the present invention comprise a first optical system that substantially collimates a light flux received from an object, a beamsplitter comprising a reflecting surface, a second optical system comprising a concave mirror and a negative lens, and a third optical system. The second optical system preferably has unit magnification.

The substantially collimated light flux exiting the first optical system is directed to the beamsplitter and is then directed by the beamsplitter to the second optical system. In the second optical system, the light flux is transmitted by the negative lens, reflected by the concave mirror, and retransmitted by the negative lens. The negative lens directs the light flux back to the beamsplitter. The light flux directed to the beamsplitter by the negative lens is substantially collimated. The beamsplitter then directs the light flux to the third lens system and a demagnified image of the object is formed on a substrate.

A catadioptric system according to the invention preferably satisfies the conditions:

$$0.7 < |\beta_m| < 1.5$$

$$|f_3/f_2| < 0.15$$

$$|\beta_3| < 0.15$$

wherein $\beta_m$ is the magnification of the concave mirror, $f_2$ is the focal length of the second optical system, $f_3$ is the focal length of the third optical system, and $\beta_3$ is the magnification of the third optical system.

The third optical system can further comprise an aperture and the catadioptric system is preferably image-side telecentric.

The beamsplitter can be a beamsplitter cube. The beamsplitter can also be a polarizing beamsplitter that selectively reflects an incident light flux according to the state of polarization of the light flux. If the beamsplitter is a polarizing beamsplitter, the catadioptric system preferably further comprises a quarter-wave retarder placed between the polarizing beamsplitter and the concave mirror. The quarter-wave retarder and the beamsplitter are preferably arranged so that light fluxes incident to the quarter-wave retarder and the beamsplitter are substantially collimated. Collimated light fluxes facilitate construction of the beamsplitter and permit superior performance.

Aberrations in the first optical system and the third optical system are readily corrected in the second optical system. The second optical system preferably has unit magnification.

The third optical system can further comprise a state-of-polarization conversion element such as a quarter-wave retarder; the conversion element is preferably arranged such that light fluxes incident to the conversion element are substantially collimated. With such a conversion element, a circularly polarized light flux can form the image. Therefore, image quality is independent of the orientation of the object.

The third optical system can comprise lenses of multiple different materials. For example, the third optical system preferably comprises a negative fused quartz lens and three positive fluorite lenses.

The first optical system can further comprise a first lens group having a positive power, a second lens group having a negative power and comprising two negative lenses, and a third lens group having a positive power and comprising two positive lenses.

The catadioptric systems are preferably image-side telecentric and satisfy the conditional expression:

$$1.2 < |f_3/f_{12}| < 2.5$$

wherein $f_{12}$ is the focal length of the second lens group of the first optical system.

The foregoing and other objects, features, and advantages of the invention will become more apparent from the following detailed description of example embodiments which proceeds with reference to the accompanying drawings.

BRIEF DESCRIPTION OF THE DRAWINGS

FIG. 2(a) depicts transverse aberrations at an image height of Y=15 mm. FIG. 2(b) depicts transverse aberrations at an image height of Y=7.5 mm. FIG. 2(c) depicts transverse aberrations on-axis, i.e., at an image height of Y=0 mm.

FIG. 4(a) depicts transverse aberrations at an image height of Y=15 mm. FIG. 4(b) depicts transverse aberrations at an image height of Y=7.5 mm. FIG. 4(c) depicts transverse aberrations on-axis, i.e., at an image height of Y=0 mm.

FIG. 6(a) depicts transverse aberrations at an image height of Y=15 mm. FIG. 6(b) depicts transverse aberrations at an image height of Y=7.5 mm. FIG. 6(c) depicts transverse aberrations on-axis, i.e., at an image height of Y=0 mm.

DETAILED DESCRIPTION

For convenience in describing preferred embodiments of the invention, directions toward an object are referred to as "objectwise"; directions toward an image are referred to as "imagewise". An axis is a line segment or series of connected line segments through centers of curvature of lens elements or mirrors. A light flux is "substantially collimated" if an angular diameter of the light flux is less than or equal to 10°. An optical system with "unit magnification" is an optical system with a magnification with magnitude between 0.8 and 1.2.

Figure 1:
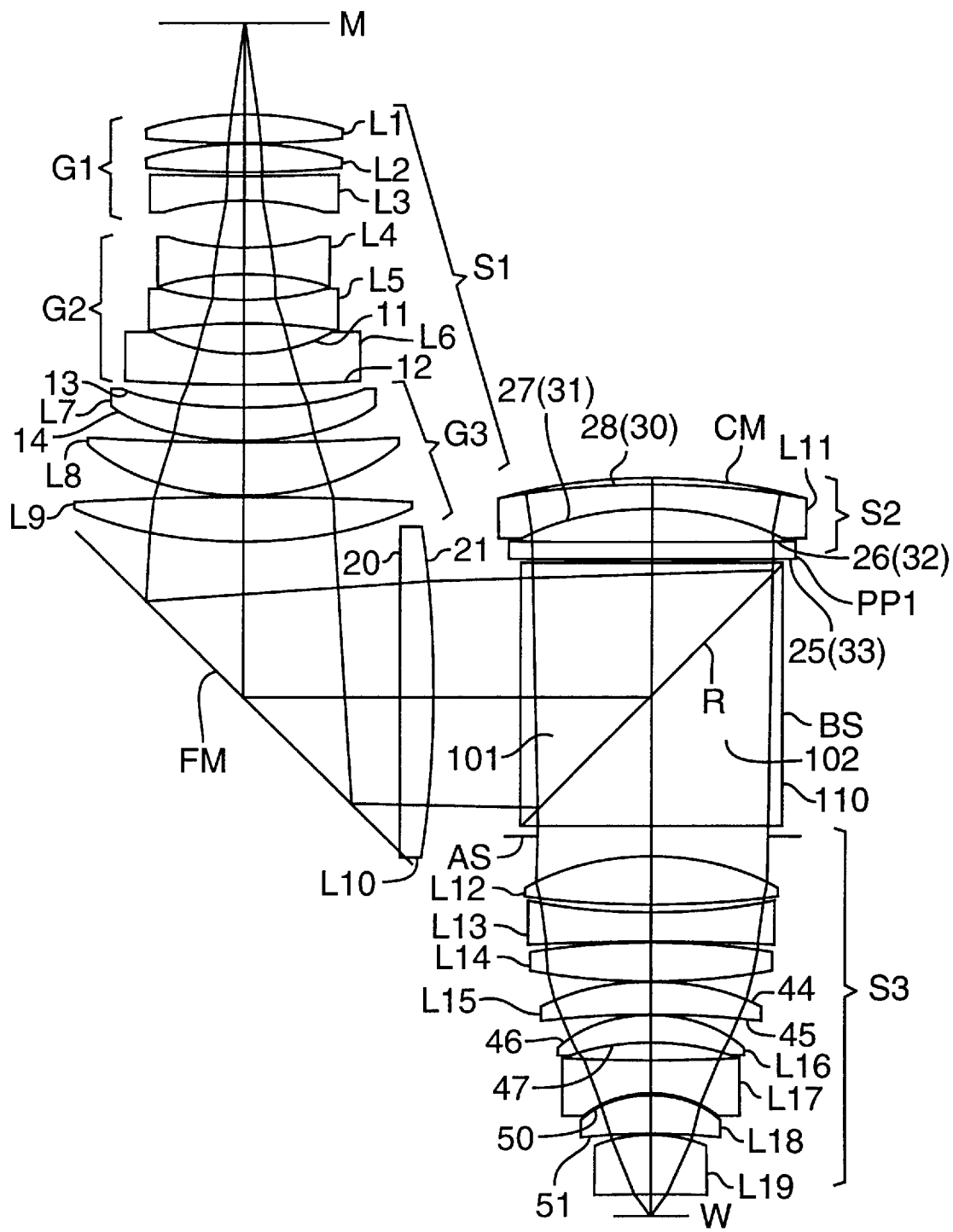
FIG. 1 is a schematic optical diagram of a catadioptric system according to Example Embodiment 1.
Figure 3:
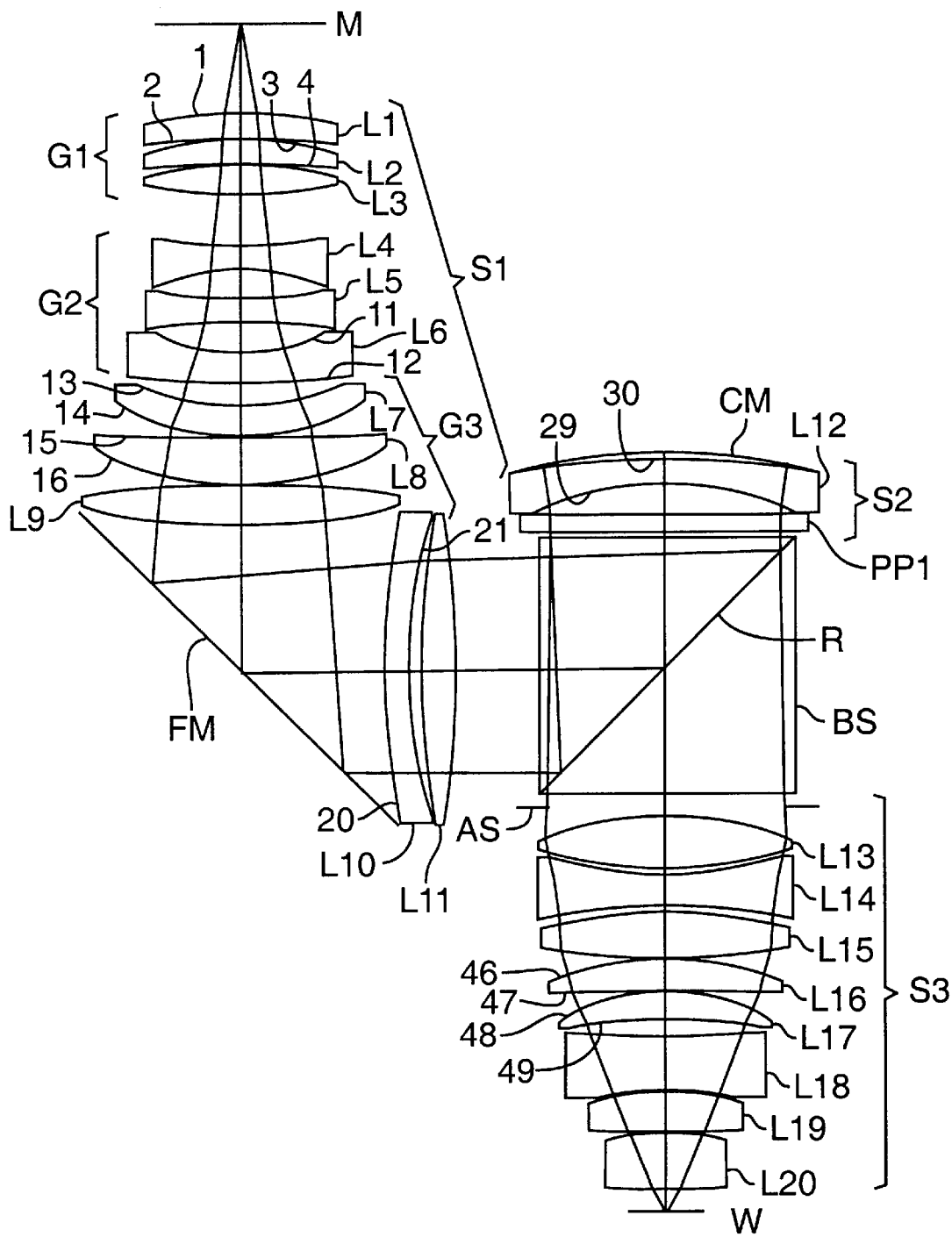
FIG. 3 is a schematic optical diagram of a catadioptric system according to Example Embodiment 2.
Figure 5:
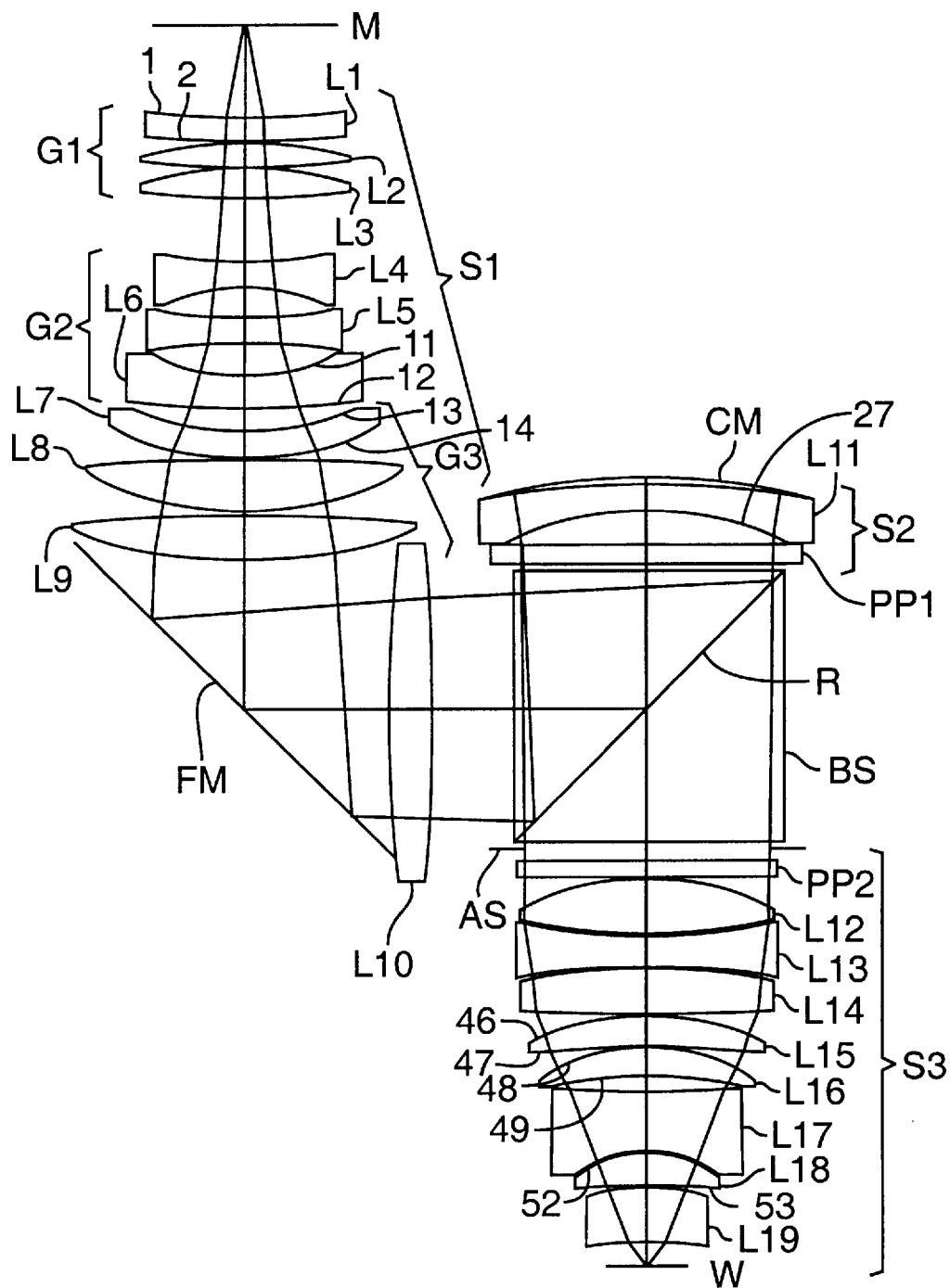
FIG. 5 is a schematic optical diagram of a catadioptric system according to Example Embodiment 3.

With reference to FIGS. 1, 3, and 5, preferred embodiments of a catadioptric system according to the invention project an image of a mask M or other object onto a wafer W or other substrate. The catadioptric systems comprise, from objectwise to imagewise along an axis, a first optical system S1, a beamsplitter BS, a second optical system S2 comprising a concave mirror CM, and a third optical system S3.

The first optical system S1 receives and substantially collimates a light flux from the object (e.g., mask M). The light flux propagates to the beamsplitter BS and reflects from a reflecting surface R of the beamsplitter BS and is incident to the second optical system S2. The light flux reflected by the beamsplitter BS is transmitted by a plane-parallel plate PP1 and is reflected by the concave mirror CM, remaining substantially collimated. Then the light flux is transmitted by the beamsplitter BS and is incident to the third optical system S3 that forms a demagnified image of the mask M.

Alternatively, the beamsplitter BS can be configured with the second optical system S2 such that the light flux from the first optical system S1 is transmitted by the beamsplitter BS to the second optical system S2. The light flux is then transmitted by the plane-parallel plate PP1 and reflected by the concave mirror CM. The light flux reflected by the concave mirror CM is then reflected by the reflecting surface R of the beamsplitter BS to the third optical system S3.

It will be apparent that the reflecting surface R can reflect a small portion or a large portion of the incident light flux. Generally, if the reflecting surface R reflects a large portion of the incident light flux, the reflecting surface R transmits a small portion of the incident light flux. Because the light flux is both reflected and transmitted by the reflecting surface R before forming the image of the object, some light flux is generally lost. The light flux lost in the beamsplitter BS frequently appears as a stray light flux on the wafer W.

In order to prevent light flux loss and stray light fluxes, the beamsplitter BS is preferably a polarizing beamsplitter. If a polarizing beamsplitter is used, then the plane parallel plate PP1 is preferably a quarter-wave retarder. A polarized light flux with an appropriate state of polarization that is incident on the beamsplitter BS is then nearly completely reflected toward the quarter-wave retarder. The light flux is transmitted by the quarter-wave retarder, reflected by the concave mirror CM, and retransmitted by the quarter-wave retarder. With an axis of the quarter-wave retarder aligned according to the state of polarization of the light flux reflected by the beamsplitter BS, the light flux exiting the quarter-wave retarder has a state of polarization orthogonal to the state of polarization of the light flux reflected by the beamsplitter BS. Therefore, the light flux retransmitted by the quarter-wave retarder is nearly completely transmitted by the beamsplitter BS.

It is preferable that light fluxes incident to the beamsplitter BS not strike the beamsplitter BS with a large range of angles of incidence; a preferable range of angles of incidence is 5° or less. A small range of angles of incidence reduces variations in beamsplitter reflectance and in retardance of the quarter-wave retarder due to differing angles of incidence. The state of polarization of light reflected by the concave mirror and retransmitted by the quarter-wave retarder is then nearly uniform, reducing light flux loss and stray light fluxes.

A beamsplitter cube is preferable to a plate-type beamsplitter because a beamsplitter cube facilitates the reduction of astigmatism and coma.

It is further preferable that the catadioptric systems be image-side telecentric.

In a slit-scan system, patterns from the mask M are transferred to the wafer W by scanning the mask M through a slit-shaped illumination region. An image of the patterns of the mask M in the illumination region is projected onto the wafer W. The mask M and wafer W are synchronously scanned so that all the patterns of the mask M are projected on the wafer W. The catadioptric systems of the present invention are appropriate for such slit-scan systems. It is preferable that the reflecting surface R of the beamsplitter BS be parallel to the longer direction of the slit-shaped illumination region. Such an orientation provides a large exposure region on the wafer and reduces the range of angles of incidence of light fluxes incident on the beamsplitter BS.

The first optical system S1 preferably comprises, from objectwise to imagewise, a first lens group G1 having positive power, a second lens group G2 having a negative power, and a third lens group G3 having a positive power. The second lens group G2 preferably comprises two negative lenses; the third lens group G3 preferably comprises two positive lenses.

The third optical system S3 preferably comprises lenses of different materials. By way of example, the third optical system preferably comprises one negative quartz lens and three positive fluorite lenses.

With reference to FIGS. 1, 3, and 5, the first optical system S1 preferably comprises a folding mirror FM placed within the first optical system. The folding mirror directs the light flux so that the wafer W and the mask M are conveniently oriented in parallel planes. It will be apparent that the folding mirror and the beamsplitter BS can provide other orientations as well and that the folding mirror can be omitted entirely.

The catadioptric systems preferably satisfy Conditional Expressions 1–3:

$$0.7 < |\beta_m| < 1.5 \tag{1}$$

$$|f_3/f_2| < 0.15 \tag{2}$$

$$|\beta_3| < 0.15 \tag{3}$$

wherein $\beta_m$ is the magnification of the concave mirror CM, $f_2$ is the focal length of the second optical system S2, $f_3$ is the focal length of the third optical system S3, and $\beta_3$ is the magnification of the third optical system S3.

Conditional Expression 1 defines a preferred range for the magnification $\beta_M$ of the concave mirror. If the magnification $\beta_m$ is greater than the upper limit or less than the lower limit of Conditional Expression 1, then light fluxes incident on the beamsplitter BS have excessively large ranges of angles of incidence. This also results in higher-order aberrations in the second optical system S2 being difficult to control. It is most preferable that the upper limit and lower limit of Conditional Expression 1 be 1.3 and 0.8, respectively.

Conditional Expression 2 defines a preferred range for a ratio of the focal length $f_2$ of the second optical system S2 to the focal length $f_3$ of the third optical system S3. If the limit of Conditional Expression 2 is exceeded, then light fluxes incident to the beamsplitter BS have excessively large ranges of angles of incidence. It is most preferable that the limit of Conditional Expression 2 be 0.1.

Conditional Expression 3 defines a preferred range for the magnification $\beta_3$ of the third optical system S3. If $\beta_3$ exceeds the limit of Conditional Expression 3, then light fluxes incident to the beamsplitter BS have excessively large ranges of angle of incidence. It is most preferable that the upper limit of Conditional Expression 3 be 0.1.

Embodiments of the invention also preferably satisfy Conditional Expression 4:

$$1.2 < |f_3/f_{12}| < 2.5 \tag{4}$$

wherein $f_{12}$ is the focal length of the second lens group G2. Conditional Expression 4 defines a preferred range for a ratio of the focal length $f_3$ of the third optical system S3 to the focal length $f_{12}$ of the second lens group G2. If the ratio $|f_3/f_{12}|$ exceeds the upper limit of Conditional Expression 4, then the power of the second lens group G2 becomes too great and correction of higher-order distortion and field curvature is difficult. Conversely, if the lower limit of Conditional Expression 4 is violated, it is difficult to correct Petzval's sum with the second optical system S2. As a result, the second optical system must additionally correct the Petzval's sum in order to compensate for the insufficient correction of the Petzval's sum by the second lens group G2. Such correction of Petzval's sum makes correction of higher-order coma and spherical aberration difficult.

Catadioptric systems according to the invention reduce the range of angles of incidence of light fluxes incident on the reflecting surface R of the beamsplitter BS. Therefore, even if the catadioptric systems are used with short-wavelength illumination, e.g., at wavelengths less than 230 nm, high-resolution images are formed and the reflecting surface R need not be complex.

EXAMPLE EMBODIMENT 1

With reference to FIG. 1, the first lens group G1 of Example Embodiment 1 comprises, from objectwise to imagewise, a biconvex lens L1, a biconvex lens L2, and a biconcave lens L3. The second lens group G2 comprises, from objectwise to imagewise, a biconcave lens L4, a biconcave lens L5, and a negative meniscus lens L6 with a concave surface 11 facing objectwise. A third lens group G3 comprises, from objectwise to imagewise, a positive meniscus lens L7 with a concave surface 13 facing objectwise, a biconvex lens L8, a biconvex lens L9, the folding mirror FM, and a positive meniscus lens L10 with a concave surface 20 facing objectwise.

Because the light flux propagates both toward and away from the beamsplitter BS, directions within the second optical group S2 toward the beamsplitter BS are referred to as "beamsplitter-wise". The second optical system S2 comprises, in order from closest to the beamsplitter BS to most distant from the beamsplitter BS, the parallel plate PP1, a negative meniscus lens L11 with a concave surface 27 facing beamsplitter-wise, and the concave mirror CM. Because the light flux propagates both toward and away from the beamsplitter BS, the surfaces 27, 28 of the negative meniscus lens L11 are encountered a second time as surfaces 31, 30, respectively. Similarly, the plane-parallel plate comprises plane surfaces 25, 26 or 33, 32.

The third optical system S3 comprises, from objectwise to imagewise, an aperture AS, a biconvex lens L12, a biconcave lens L13, a biconvex lens L14, a positive meniscus lens L15 with a convex surface 44 facing objectwise, a positive meniscus lens L16 with a convex surface 46 facing objectwise, a biconcave lens L17, a positive meniscus lens L18 with a convex surface 50 facing objectwise, and a biconvex lens L19.

The aperture AS permits adjustment of a coherence factor σ. The catadioptric system of Example Embodiment 1 is thus useful with phase-shift methods for increasing depth of focus and resolution, such as those disclosed in Japanese laid-open patent document 50811 (1987). In such phase-shift methods a phase of a portion of the mask is shifted from the phase of another portion. Example Embodiment 1 is also applicable to other methods such as pupil-plane filtering.

If the beamsplitter BS is a polarizing beamsplitter, then the plane-parallel plate PP1 can be a quarter-wave retarder or a support plate.

The beamsplitter BS comprises two right angle prisms 101, 102 cemented together forming a beamsplitter cube. With reference to FIG. 1, the reflecting surface R of the beamsplitter BS reflects a light flux received from the first optical system S1 and transmits a light flux from the second optical system S2. The reflecting surface R is generally a multilayer coating deposited on respective surfaces of the right angle prisms 101, 102. The multilayer coating can be readily configured so that the reflecting surface R transmits the light flux from the first optical system S1 and reflects the light flux from the second optical system S2. In such a case, the second optical system S2 is accordingly placed adjacent a surface 110 of the beamsplitter BS.

Table 1 lists specifications for Example Embodiment 1. In Table 1, β is a demagnification of the catadioptric system, $NA_i$ is image-side numerical aperture, and $d_0$ is an axial distance between the object and a most objectwise surface of the catadioptric system. The first column lists surfaces numbered in order from objectwise to imagewise; the second column, labeled "r", lists corresponding curvature radii of the lens surfaces; the third column, labeled "d", lists the axial separation of a surface and an adjacent, imagewise surface; the fourth column, labeled "n", lists the refractive indices of the corresponding lens elements; and the fifth column, labeled "Group", provides the lens group number in which each corresponding element is situated.

A sign convention is used in which the radius of curvature r of a surface is positive for a convex surface facing objectwise between the object and the flat mirror FM. Between the flat mirror FM and the beamsplitter BS and the concave mirror CM, convex surfaces facing the beamsplitter BS are positive. A convex surface facing imagewise between the beamsplitter BS and the image is positive. Furthermore, the sign of the surface separation d is negative between the flat mirror FM and the beamsplitter BS, as well as between the concave mirror CM and the image. Elsewhere, the sign is positive. In Table 1, n represents the refractive index at a wavelength of λ=193.4 nm (wavelength of ArF excimer laser). In the first Example Embodiment 1, quartz (n=1.560194) and fluorite (n=1.501375) are used as the optical materials. Dispersion values ν are listed for a wavelength range of 193.4 nm±0.1 nm.

TABLE 1

(Example Embodiment 1)

Overall Specifications

| | |
|---|---|
| β | −0.25 |
| $NA_i$ | 0.60 |
| $d_0$ | 70.000 mm |
| ν | 1780 (quartz) |
| ν | 2550 (fluorite) |

Element Specifications

| Surf. No. | r (mm) | d (mm) | n | Element |
|---|---|---|---|---|
| 1 | 314.200 | 20.000 | 1.560194 | L1 |
| 2 | −1091.965 | 0.500 | | |
| 3 | 265.607 | 22.880 | 1.560194 | L2 |
| 4 | −574.035 | 1.392 | | |
| 5 | −13337.789 | 20.000 | 1.560194 | L3 |
| 6 | 332.064 | 35.916 | | |
| 7 | −275.075 | 20.000 | 1.560194 | L4 |
| 8 | 206.410 | 19.511 | | |
| 9 | −271.275 | 20.000 | 1.560194 | L5 |
| 10 | 1139.570 | 22.244 | | |
| 11 | −147.673 | 23.783 | 1.560194 | L6 |
| 12 | −821.846 | 18.163 | | |
| 13 | −280.185 | 24.133 | 1.560194 | L7 |
| 14 | −202.276 | 0.500 | | |

TABLE 1-continued (Example Embodiment 1)

| | | | | |
|---|---|---|---|---|
| 15 | 69284.072 | 41.298 | 1.501375 | L8 |
| 16 | −230.221 | 0.500 | | |
| 17 | 2305.962 | 34.012 | 1.560194 | L9 |
| 18 | −377.993 | 120.000 | | |
| 19 | ∞ | −120.000 | | FM |
| 20 | 14475.428 | −25.000 | 1.560194 | L10 |
| 21 | 1059.011 | −70.000 | | |
| 22 | ∞ | −100.000 | 1.560194 | BS |
| 23 | ∞ | 100.000 | 1.560194 | |
| 24 | ∞ | 2.000 | | |
| 25 | ∞ | 12.000 | 1.560194 | PP1 |
| 26 | ∞ | 25.280 | | |
| 27 | −247.692 | 20.000 | 1.560194 | L11 |
| 28 | −759.263 | 4.155 | | |
| 29 | −587.489 | −4.155 | | CM |
| 30 | −759.263 | −20.000 | 1.560194 | L11 |
| 31 | −247.692 | −25.280 | | |
| 32 | ∞ | −12.000 | 1.560194 | PP1 |
| 33 | ∞ | −2.000 | | |
| 34 | ∞ | −100.000 | 1.560194 | BS |
| 35 | ∞ | −100.000 | 1.560194 | |
| 36 | ∞ | −10.000 | | |
| 37 | ∞ | −17.527 | | AS |
| 38 | −195.435 | −36.117 | 1.501375 | L12 |
| 39 | 988.951 | −6.087 | | |
| 40 | 479.971 | 21.208 | 1.560194 | L13 |
| 41 | −795.270 | −0.500 | | |
| 42 | −547.870 | −31.004 | 1.501375 | L14 |
| 43 | 629.850 | −0.500 | | |
| 44 | −192.633 | −25.000 | 1.501375 | L15 |
| 45 | −649.405 | −0.500 | | |
| 46 | −129.125 | −22.497 | 1.501375 | L16 |
| 47 | −316.689 | −11.395 | | |
| 48 | 910.042 | −24.583 | 1.560194 | L17 |
| 49 | −85.152 | −1.877 | | |
| 50 | −86.103 | −31.270 | 1.501375 | L18 |
| 51 | −1752.508 | −0.500 | | |
| 52 | −145.029 | −45.000 | 1.560194 | L19 |
| 53 | 2827.090 | −17.000 | | |

Values of Conditional Expressions

| | |
|---|---|
| $β_m$ | 0.99999 |
| $f_2$ | −1859.89150 mm |
| $β_3$ | 0.04057 |
| $f_3$ | 144.38775 mm |
| $f_{12}$ | −84.02783 mm |
| (1) $\|β_m\|$ | 0.99999 |
| (2) $\|f_3/f_2\|$ | 0.07763 |
| (3) $\|β_3\|$ | 0.04057 |
| (4) $\|f_3/f_{12}\|$ | 1.71833 |

Figure 2A:
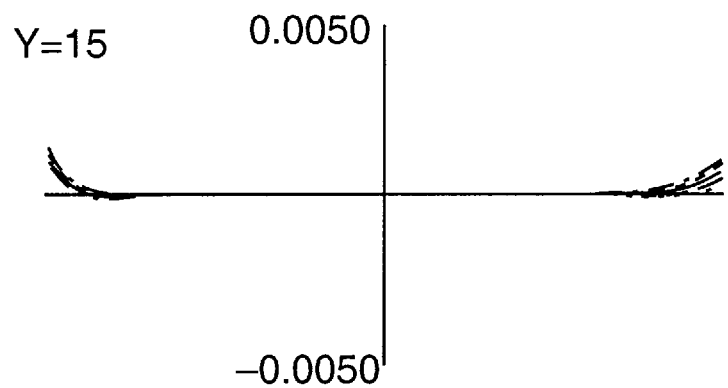
FIGS. 2(a)–2(c) are plots of transverse aberrations exhibited by Example Embodiment 1.
Figure 2B:
Figure 2C:
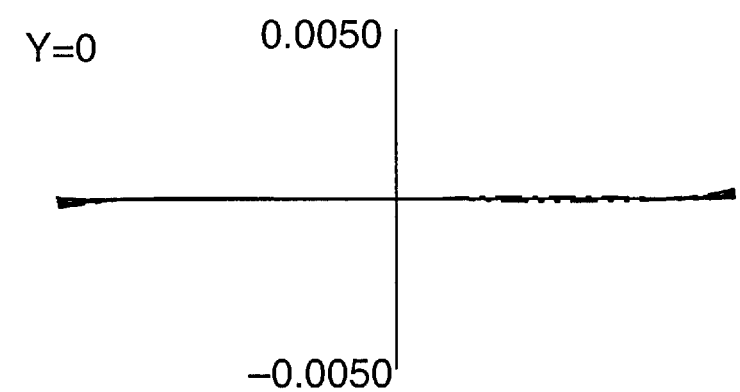

FIG. 2(a) depicts graphs of transverse aberrations for Example Embodiment 1 at an image height of Y=15 mm; FIG. 2(b) depicts graphs of transverse aberrations at an image height of Y=7.5 mm; and FIG. 2(c) depicts graphs of transverse aberrations on axis, i.e., at an image height of Y=0 mm. The transverse aberrations are plotted at wavelengths of λ=193.5 nm, 193.45 nm, 193.4 nm, 193.35 nm, and 193.3 nm, respectively. With reference to FIG. 2, it is readily apparent that aberrations are well-corrected. In particular, chromatic aberration is well-corrected within the wavelength range 193.4 nm±0.1 nm.

EXAMPLE EMBODIMENT 2

With reference to FIG. 3, the first lens group G1 of Example Embodiment 2 comprises, from objectwise to imagewise, a positive meniscus lens L1 with a convex surface 1 facing objectwise, a positive meniscus lens L2 with a convex surface 3 facing objectwise, and a biconvex lens L3. The second lens group G2 comprises, from objectwise to imagewise, a biconcave lens L4, a biconcave lens L5, and a negative meniscus lens L6 with a concave surface 11 facing objectwise. The third lens group G3 comprises, from objectwise to imagewise, a positive meniscus lens L7 with a concave surface 13 facing objectwise, a positive meniscus L8 lens with a concave surface 15 facing objectwise, a biconvex lens L9, the folding mirror FM, a negative meniscus lens L10 with a convex surface 20 facing objectwise, and a biconvex lens L11.

The second optical system S2 comprises, in order from closest to the beamsplitter BS to most distant from the beamsplitter BS, the parallel plate PP1, a negative meniscus lens L12 with a concave surface 29 facing beamsplitterwise, and the concave mirror CM.

The third optical system S3 comprises, from objectwise to imagewise, an aperture AS, a biconvex lens L13, a biconcave lens L14, a biconvex lens L15, a positive meniscus lens L16 with a convex surface 46 facing objectwise, a positive meniscus lens L17 with a convex surface 48 facing objectwise, a biconcave lens L18, a biconvex lens L19, and a biconvex lens L20.

As in Example Embodiment 1, the beamsplitter BS can be a polarizing beamsplitter and the parallel plate PP1 can be a quarter-wave retarder or a support plate. The beamsplitter BS is preferably a beamsplitter cube having a reflecting surface R.

Table 2 lists specifications for Example Embodiment 2. Definitions and sign conventions are the same as those used with Example Embodiment 1. Surfaces of the second optical system S2 are listed twice in Table 2 because the light flux propagating from the mask M to the wafer W encounters the surfaces of the second group S2 twice.

TABLE 2

(Example Embodiment 2)

Overall Specifications

| | |
|---|---|
| β | −0.25 |
| $NA_i$ | 0.60 |
| $d_0$ | 70.000 mm |
| ν | 1780 (quartz) |
| ν | 2550 (fluorite) |

Element Specifications

| Surf. No. | r (mm) | d (mm) | n | Element |
|---|---|---|---|---|
| 1 | 555.994 | 20.000 | 1.560194 | L1 |
| 2 | 729.291 | 0.500 | | |
| 3 | 333.918 | 20.000 | 1.560194 | L2 |
| 4 | 985.568 | 0.500 | | |
| 5 | 330.373 | 22.384 | 1.560194 | L3 |
| 6 | −476.963 | 41.837 | | |
| 7 | −358.637 | 20.000 | 1.560194 | L4 |
| 8 | 199.211 | 21.596 | | |
| 9 | −244.073 | 20.000 | 1.560194 | L5 |
| 10 | 645.547 | 22.034 | | |
| 11 | −167.097 | 25.269 | 1.560194 | L6 |
| 12 | −702.581 | 18.292 | | |
| 13 | −196.727 | 23.587 | 1.560194 | L7 |
| 14 | −189.086 | 1.476 | | |
| 15 | −2889.795 | 38.060 | 1.560194 | L8 |
| 16 | −241.138 | 0.500 | | |
| 17 | 889.873 | 33.956 | 1.560194 | L9 |
| 18 | −486.862 | 115.000 | | |
| 19 | ∞ | −115.000 | | FM |
| 20 | −683.956 | −20.000 | 1.560194 | L10 |
| 21 | −398.742 | −11.922 | | |
| 22 | −827.833 | −25.379 | 1.501375 | L11 |
| 23 | 965.222 | −70.000 | | |
| 24 | ∞ | −100.000 | 1.560194 | BS |
| 25 | ∞ | 100.000 | 1.560194 | |
| 26 | ∞ | 2.000 | | |
| 27 | ∞ | 12.000 | 1.560194 | PP1 |
| 28 | ∞ | 25.802 | | |
| 29 | −245.802 | 20.000 | 1.560194 | L12 |
| 30 | −789.602 | 3.853 | | |
| 31 | −621.462 | −3.853 | | CM |
| 32 | −789.602 | −20.000 | 1.560194 | L12 |
| 33 | −245.802 | −25.802 | | |
| 34 | ∞ | −12.000 | 1.560194 | PP1 |
| 35 | ∞ | −2.000 | | |
| 36 | ∞ | −100.000 | 1.560194 | BS |
| 37 | ∞ | −100.000 | 1.560194 | |
| 38 | ∞ | −10.000 | | |
| 39 | ∞ | −10.000 | | AS |
| 40 | −247.504 | −43.599 | 1.501375 | L13 |
| 41 | 360.874 | −4.625 | | |
| 42 | 328.629 | −24.769 | 1.560194 | L14 |
| 43 | −537.148 | −4.554 | | |
| 44 | −400.000 | −35.000 | 1.501375 | L15 |
| 45 | 590.915 | −0.500 | | |
| 46 | −222.033 | −25.000 | 1.501375 | L16 |
| 47 | −1399.535 | −0.500 | | |
| 48 | −151.374 | −25.173 | 1.501375 | L17 |
| 49 | −523.965 | −10.596 | | |
| 50 | 799.139 | −44.009 | 1.560194 | L18 |
| 51 | −217.225 | −2.500 | | |
| 52 | −244.374 | −31.923 | 1.560194 | L19 |
| 53 | 3319.649 | −0.500 | | |
| 54 | −200.174 | −45.000 | 1.560194 | L20 |
| 55 | 13505.786 | −17.000 | | |

Values of Conditional Expressions

| | |
|---|---|
| $β_m$ | 1.19675 |
| $f_2$ | −4132.86154 mm |
| $β_3$ | −0.00509 |
| $f_3$ | 152.98618 mm |
| $f_{12}$ | −87.67512 mm |
| (1) $|β_m|$ | 1.19675 |
| (2) $|f_3/f_2|$ | 0.03702 |
| (3) $|β_3|$ | 0.00509 |
| (4) $|f_3/f_{12}|$ | 1.74492 |

Figure 4A:
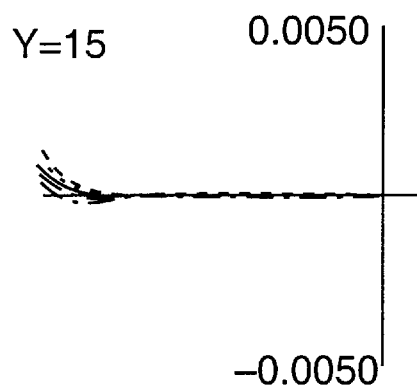
FIGS. 4(a)–4(c) are plots of transverse aberrations exhibited by Example Embodiment 2.
Figure 4B:
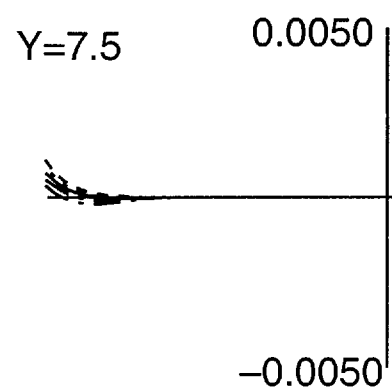
Figure 4C:
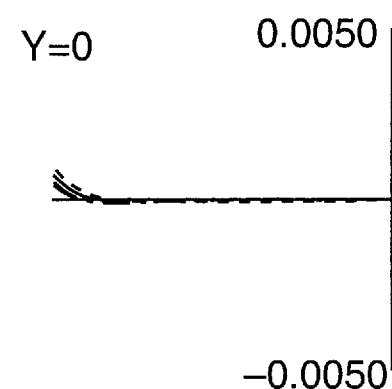

FIG. 4(a) depicts graphs of transverse aberrations for Example Embodiment 2 at an image height of Y=15 mm; FIG. 4(b) depicts graphs of transverse aberrations at an image height of Y=7.5 mm; and FIG. 4(c) depicts graphs of transverse aberrations on axis, i.e., at an image height of Y=0 mm. The transverse aberrations are plotted at wavelengths of λ=193.5 nm, 193.45 nm, 193.4 nm, 193.35 nm, and 193.3 nm, respectively. With reference to FIG. 4, it is readily apparent that aberrations are well-corrected. In particular, chromatic aberration is well-corrected within the wavelength range 193.4 nm±0.1 nm.

EXAMPLE EMBODIMENT 3

With reference to FIG. 5, the first lens group G1 comprises, from objectwise to imagewise, a negative meniscus lens L1 with a concave surface 1 facing objectwise, a biconvex lens L2, and a biconvex lens L3. The second lens group G2 comprises, from objectwise to imagewise, a biconcave lens L4, a biconcave lens L5, and a negative meniscus lens L6 with a concave surface 11 facing objectwise. The third lens group G3 comprises, from objectwise to imagewise, a positive meniscus lens L7 with a concave surface 13 facing objectwise, a biconvex lens L8, a biconvex lens L9, a flat mirror FM, and a biconvex lens L10.

The second optical system S2 comprises, in order from closest to the beamsplitter BS to most distant from the beamsplitter BS, the parallel plate PP1, a negative meniscus lens L11 with a concave surface 27 facing beamsplitter-wise, and the concave mirror CM.

The third optical system S3 comprises, from objectwise to imagewise, an aperture AS, a parallel plate PP2, a biconvex lens L12, a biconcave lens L13, a biconvex lens L14, a positive meniscus lens L15 with a convex surface 46 facing objectwise, a positive meniscus lens L16 with a convex surface 48 facing objectwise, a biconcave lens L17, a positive meniscus lens L18 with a convex surface 52 facing objectwise, and a biconvex lens L19. The parallel plate PP2 provides a mechanism for aberration compensation during catadioptric system manufacturing.

As in Example Embodiments 1 and 2, the beamsplitter BS can be a polarizing beamsplitter and the parallel plate PP1 can be a quarter-wave retarder or a support plate. The beamsplitter BS is preferably a beamsplitter cube having a reflecting surface R.

Table 3 lists specifications for Example Embodiment 3. Definitions and sign conventions are the same as those used with Example Embodiment 1.

TABLE 3

(Example Embodiment 3)

Overall Specifications

| | |
|---|---|
| β | -0.25 |
| $NA_i$ | 0.60 |
| $d_0$ | 70.000 mm |
| ν | 1780 (quartz) |
| ν | 2550 (fluorite) |

Element Specifications

| Surf. No. | r (mm) | d (mm) | n | Element |
|---|---|---|---|---|
| 1 | -497.618 | 20.000 | 1.560194 | L1 |
| 2 | -875.940 | 0.500 | | |
| 3 | 337.655 | 20.000 | 1.560194 | L2 |
| 4 | -950.510 | 0.500 | | |
| 5 | 279.194 | 20.715 | 1.560194 | L3 |
| 6 | -1596.131 | 50.228 | | |
| 7 | -442.564 | 20.000 | 1.560194 | L4 |
| 8 | 182.303 | 21.885 | | |
| 9 | -267.157 | 20.000 | 1.560194 | L5 |
| 10 | 490.095 | 24.760 | | |
| 11 | -152.766 | 25.567 | 1.560194 | L6 |
| 12 | -929.646 | 18.053 | | |
| 13 | -251.508 | 24.406 | 1.560194 | L7 |
| 14 | -200.005 | 0.500 | | |
| 15 | 13855.562 | 39.787 | 1.501375 | L8 |
| 16 | -241.464 | 0.500 | | |
| 17 | 1728.652 | 35.323 | 1.560194 | L9 |
| 18 | -375.728 | 115.000 | | |
| 19 | ∞ | -115.000 | | FM |
| 20 | -3357.182 | -30.000 | 1.560194 | L10 |
| 21 | 2081.751 | -70.000 | | |
| 22 | ∞ | -100.000 | 1.560194 | BS |
| 23 | ∞ | 100.000 | 1.560194 | |
| 24 | ∞ | 2.000 | | |
| 25 | ∞ | 12.000 | 1.560194 | PP1 |
| 26 | ∞ | 25.653 | | |
| 27 | -247.315 | 20.000 | 1.560194 | L11 |
| 28 | -806.848 | 4.137 | | |
| 29 | -615.891 | -4.137 | | CM |
| 30 | -806.848 | -20.000 | 1.560194 | L11 |
| 31 | -247.315 | -25.653 | | |
| 32 | ∞ | -12.000 | 1.560194 | PP1 |
| 33 | ∞ | -2.000 | | |
| 34 | ∞ | -100.000 | 1.560194 | BS |
| 35 | ∞ | -100.000 | 1.560194 | |
| 36 | ∞ | -10.000 | | |
| 37 | ∞ | -10.000 | | AS |

TABLE 3-continued (Example Embodiment 3)

| | | | | |
|---|---|---|---|---|
| 38 | ∞ | -12.000 | 1.560194 | PP2 |
| 39 | ∞ | -0.500 | | |
| 40 | -216.191 | -43.772 | 1.501375 | L12 |
| 41 | 460.928 | -2.467 | | |
| 42 | 420.850 | -23.112 | 1.560194 | L13 |
| 43 | -888.877 | -0.500 | | |
| 44 | -396.225 | -35.000 | 1.501375 | L14 |
| 45 | 1739.264 | -0.500 | | |
| 46 | -204.053 | -25.000 | 1.501375 | L15 |
| 47 | -679.139 | -0.500 | | |
| 48 | -144.496 | -23.801 | 1.501375 | L16 |
| 49 | -404.349 | -10.700 | | |
| 50 | 1098.048 | -45.000 | 1.560194 | L17 |
| 51 | -74.633 | -1.798 | | |
| 52 | -75.091 | -25.467 | 1.501375 | L18 |
| 53 | -766.110 | -0.500 | | |
| 54 | -138.815 | -45.000 | 1.560194 | L19 |
| 55 | 4034.485 | -17.000 | | |

Conditional Expressions

| | |
|---|---|
| $\beta_m$ | 1.20927 |
| $f_2$ | -3697.92106 mm |
| $\beta_3$ | -0.00451 |
| $f_3$ | 152.73332 mm |
| $f_{12}$ | -81.65645 mm |
| (1) $|\beta_m|$ | 1.209275 |
| (2) $|f_3/f_2|$ | 0.041302 |
| (3) $|\beta_3|$ | 0.004519 |
| (4) $|f_3/f_{12}|$ | 1.870442 |

Figure 6A:
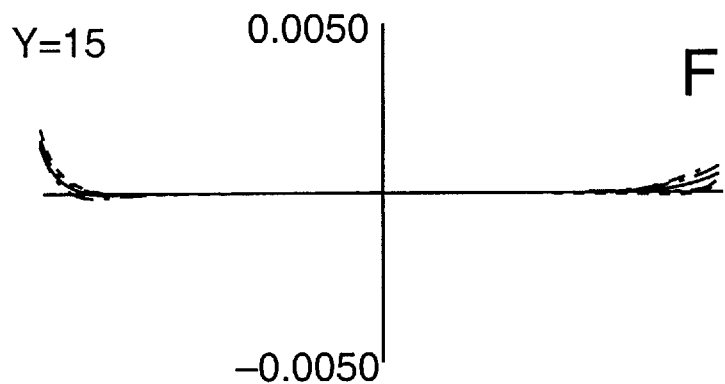
FIGS. 6(a)–6(c) are plots of transverse aberrations exhibited by Example Embodiment 3.
Figure 6B:
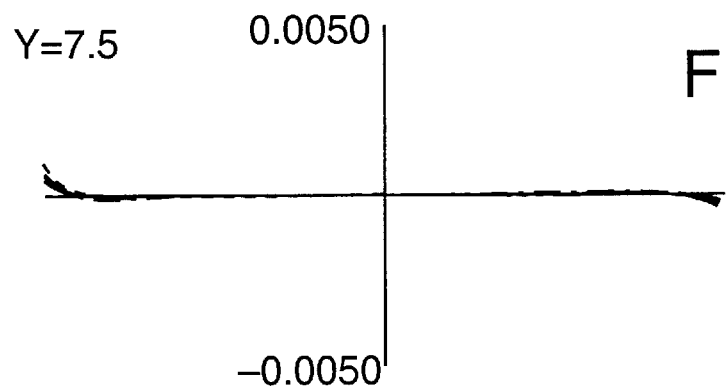
Figure 6C:
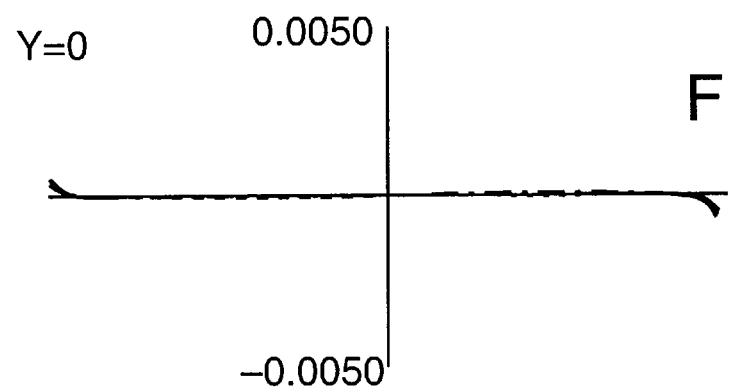

FIG. 6(a) depicts graphs of transverse aberrations for Example Embodiment 2 at an image height of Y=15 mm; FIG. 6(b) depicts graphs of transverse aberrations at an image height of Y=7.5 mm; and FIG. 6(c) depicts graphs of transverse aberrations on axis, i.e., at an image height of Y=0 mm. The transverse aberrations are plotted at wavelengths of λ=193.5 nm, 193.45 nm, 193.4 nm, 193.35 nm, and 193.3 nm, respectively. With reference to FIG. 6, it is readily apparent that aberrations are well-corrected. In particular, chromatic aberration is well-corrected within the wavelength range 193.4 nm±0.1 nm.

The parallel plate PP2 can also be a state of polarization conversion element such as a quarter-wave retarder. For example, if the light flux exiting the beamsplitter BS is converted to a circular state of polarization by the parallel plate PP2, the resolution of the image of the mask M on the wafer W does not depend on the orientation of the mask M with respect to the state of polarization of the light flux from the mask M.

Having illustrated and demonstrated the principles of the invention in a example embodiments, it should be apparent to those skilled in the art that the example embodiments can be modified in arrangement and detail without departing from such principles. I claim as the invention all that comes within the scope of these claims.

What is claimed is:

1. A catadioptric system for projecting an image of an object onto a substrate, the catadioptric system comprising:

(a) a first optical system that receives a light flux from an object and substantially collimates the light flux;

(b) a beamsplitter comprising a reflecting surface, the beamsplitter receiving the light flux from the first optical system;

(c) a second optical system having a focal length $f_2$ and exhibiting unit magnification, the second optical system comprising a concave mirror and a negative lens, the negative lens receiving the light flux from the beamsplitter and directing the light flux to the concave mirror, the concave mirror having a magnification of $\beta_M$ and reflecting the light flux back through the negative lens to the beamsplitter;

(d) a third optical system having a focal length $f_3$ and a magnification $\beta_3$, the third optical system receiving the light flux reflected by the concave mirror and forming an image of the object on the substrate; and (e) the catadioptric system satisfying the conditional expressions:

$$0.7<|\beta_m|<1.5$$

$$|f_3/f_2|<0.15$$

$$|\beta_3|<0.15.$$

2. The catadioptric system of claim 1, wherein the beamsplitter is a polarizing beamsplitter, the catadioptric system further comprising a quarter-wave retarder placed between the polarizing beamsplitter and the concave mirror.

3. The catadioptric system of claim 1, wherein the beamsplitter is a beamsplitter cube.

4. The catadioptric system of claim 1, wherein the first optical system comprises, from objectwise to imagewise:

a first lens group having a positive power;

a second lens group having a negative power and a focal length $f_{12}$, the first lens group comprising two negative lenses; and a third lens group having a positive power and comprising two positive lenses; and wherein the catadioptric system is image-side telecentric and satisfies the conditional expression $$1.2<|f_3/f_{12}|<2.5.$$

5. The catadioptric system of claim 4, wherein the beamsplitter is a beamsplitter cube.

6. The catadioptric system of claim 1, wherein the catadioptric system is image-side telecentric and the third optical system further comprises an aperture.

7. The catadioptric system of claim 6, wherein the beamsplitter is a polarizing beamsplitter, the catadioptric system further comprising a quarter-wave retarder placed between the polarizing beamsplitter and the concave mirror.

8. The catadioptric optical system of claim 6, wherein the third optical system comprises a state-of-polarization conversion element placed in a location where the light flux is substantially collimated.

9. The catadioptric system of claim 8, wherein the beamsplitter is a beamsplitter cube.

10. The catadioptric system of claim 2, wherein the first optical system comprises, from objectwise to imagewise:

a first lens group having a positive power;

a second lens group having a negative power and a focal length $f_{12}$, the second lens group comprising two negative lenses; and a third lens group having a positive power and comprising two positive lenses; and wherein the catadioptric system is image-side telecentric and satisfies the conditional expression $$1.2<|f_3/f_{12}|<2.5.$$

11. The catadioptric system of claim 1, transmissive to a light flux having a wavelength of 230 nm or less.

12. The catadioptric system of claim 1, wherein the third optical system comprises lens elements of different materials.

13. The catadioptric system of claim 1, wherein the third optical system comprises, from objectwise to imagewise, a negative fused quartz lens and three positive fluorite lenses.

14. The catadioptric system of claim 2, wherein the third optical system comprises lens elements of different materials.

15. The catadioptric system of claim 2, wherein the third optical system comprises, from objectwise to imagewise, a negative fused quartz lens and three positive fluorite lenses.

16. The catadioptric system of claim 4, wherein the third optical system comprises lens elements of different materials.

17. The catadioptric system of claim 4, wherein the third optical system comprises, from objectwise to imagewise, a negative fused quartz lens and three positive fluorite lenses.

18. The catadioptric system of claim 6, wherein the third optical system comprises, from objectwise to imagewise, a negative fused quartz lens and three positive fluorite lenses.

19. The catadioptric system of claim 10, wherein the third optical system comprises, from objectwise to imagewise, a negative fused quartz lens and three positive fluorite lenses.

20. The catadioptric system of claim 1, satisfying the conditional expressions:

$$0.8<|\beta_m|<1.3$$

$$|f_3/f_2|<0.1$$

$$|\beta_3|<0.1.$$

* * * * *

UNITED STATES PATENT AND TRADEMARK OFFICE
CERTIFICATE OF CORRECTION

PATENT NO. : 5,805,357

DATED : September 8, 1998

INVENTOR(S) : YASUHIRO OMURA

It is certified that error appears in the above-indentified patent and that said Letters Patent is hereby corrected as shown below:

<u>In the Claims:</u>

Column 14, line 50, claim 20, "$|\beta_3 < 0.1$" should be --$|\beta_3| < 0.1$--.

Signed and Sealed this

Twenty-eighth Day of September, 1999

Attest:

Q. TODD DICKINSON

*Attesting Officer*     *Acting Commissioner of Patents and Trademarks*